(12) United States Patent
Nakanishi et al.

(10) Patent No.: US 11,563,302 B2
(45) Date of Patent: Jan. 24, 2023

(54) HEATER-INTEGRATED RIDGE TYPE OPTICAL SEMICONDUCTOR OPTICAL DEVICE

(71) Applicant: Lumentum Japan, Inc.

(72) Inventors: Akira Nakanishi, Tokyo (JP); Noriko Sasada, Kanagawa (JP); Takayuki Nakajima, Tokyo (JP); Yuji Sekino, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 233 days.

(21) Appl. No.: 17/110,195

(22) Filed: Dec. 2, 2020

(65) Prior Publication Data
US 2021/0376565 A1    Dec. 2, 2021

(30) Foreign Application Priority Data

May 29, 2020  (JP) .............................. JP2020-094149
Jul. 21, 2020  (JP) .............................. JP2020-124255

(51) Int. Cl.
*H01S 5/024*   (2006.01)
*H01S 5/22*    (2006.01)
*H01S 5/042*   (2006.01)

(52) U.S. Cl.
CPC ........ *H01S 5/02453* (2013.01); *H01S 5/0425* (2013.01); *H01S 5/22* (2013.01)

(58) Field of Classification Search
CPC .................................................... H01S 5/02453
USPC ............................................................ 372/34
See application file for complete search history.

(56) References Cited

U.S. PATENT DOCUMENTS

2004/0136414 A1*  7/2004  Matsumoto ............. H01S 5/026
                                                        372/20
2008/0063016 A1*  3/2008  Bhatia ................. H01S 5/06256
                                                        372/34

FOREIGN PATENT DOCUMENTS

JP    2000294869 A    10/2000
JP    2010182999 A    8/2010

* cited by examiner

*Primary Examiner* — Tuan N Nguyen
(74) *Attorney, Agent, or Firm* — Harrity & Harrity, LLP

(57) ABSTRACT

A ridge type semiconductor optical device includes a first conductivity type semiconductor layer including at least a first stripe section; an active layer including at least an active stripe section on the first stripe section; a second conductivity type semiconductor layer including at least a second stripe section on the active stripe section; a ridge electrode on the second stripe section; an insulation film on an end face of each of the first stripe section, the active stripe section, and the second stripe section; and a film heater on the insulation film, the film heater overlapping with the end face of at least the first stripe section.

14 Claims, 17 Drawing Sheets

HEATER-INTEGRATED RIDGE TYPE OPTICAL SEMICONDUCTOR OPTICAL DEVICE

CROSS-REFERENCE TO RELATED APPLICATIONS

The present application claims priority from Japanese patent applications JP2020-094149 filed on May 29, 2020 and JP2020-124255 filed on Jul. 21, 2020, which are hereby expressly incorporated by reference herein.

BACKGROUND

Some implementations described herein relate to a heater-integrated ridge type semiconductor optical device.

Recently, semiconductor optical devices such as semiconductor laser elements are requested to work in a wider operation temperature range. To stably work in such a wider temperature range, a Peltier device is disadvantageous due to a larger package size and higher cost. Temperature adjustment measures using a heater are available. For example, by employing a design structure where a satisfactory optical output is achievable at high temperature, heating with a heater only in a low-temperature environment can prevent current density from dropping at low temperature, enabling stable operation.

Some techniques may use a thin film heater just on an upper electrode of a laser. Some techniques may use thin film heaters on both sides of a stripe structure for a light confinement zone.

The aforementioned thin film heaters are only provided to be away from an active layer and cannot sufficiently transmit heat generated by itself to the light confinement zone, making it likely to deteriorate its heat efficiency.

SUMMARY

Some implementations described herein aim at improving heat efficiency.

A ridge type semiconductor optical device may include a first conductivity type semiconductor layer including at least a first stripe section; an active layer including at least an active stripe section on the first stripe section; a second conductivity type semiconductor layer including at least a second stripe section on the active stripe section; a ridge electrode on the second stripe section; an insulation film on an end face of each of the first stripe section, the active stripe section, and the second stripe section; and a film heater on the insulation film, the film heater overlapping with the end face of at least the first stripe section.

The film heater may overlap with an end face of a first stripe section, being close to an active stripe section, thereby improving heat efficiency.

DETAILED DESCRIPTION

Figure 1:
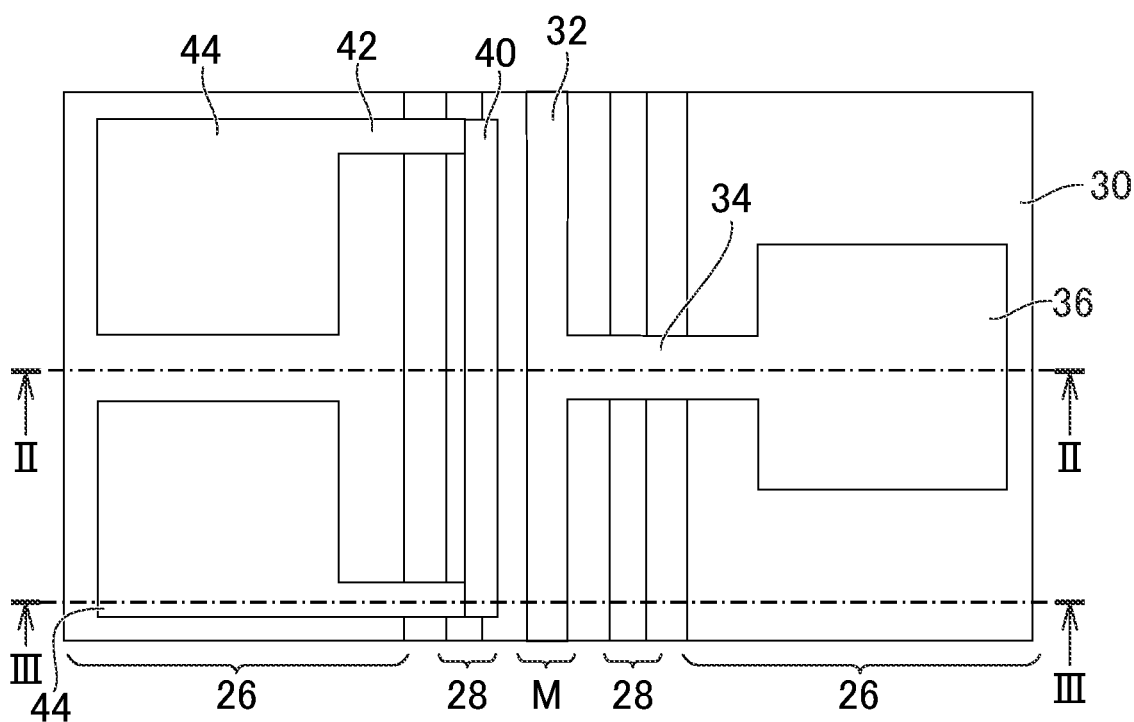
FIG. 1 is a plan view of a ridge type semiconductor optical device according to an implementation.

Hereinafter, some implementations will be described specifically and in detail with reference to drawings. In all the drawings, the members with the same reference numerals have the identical or same feature and their repetitive description will be omitted. Sizes of figures do not always comply with magnification.

Figure 2:
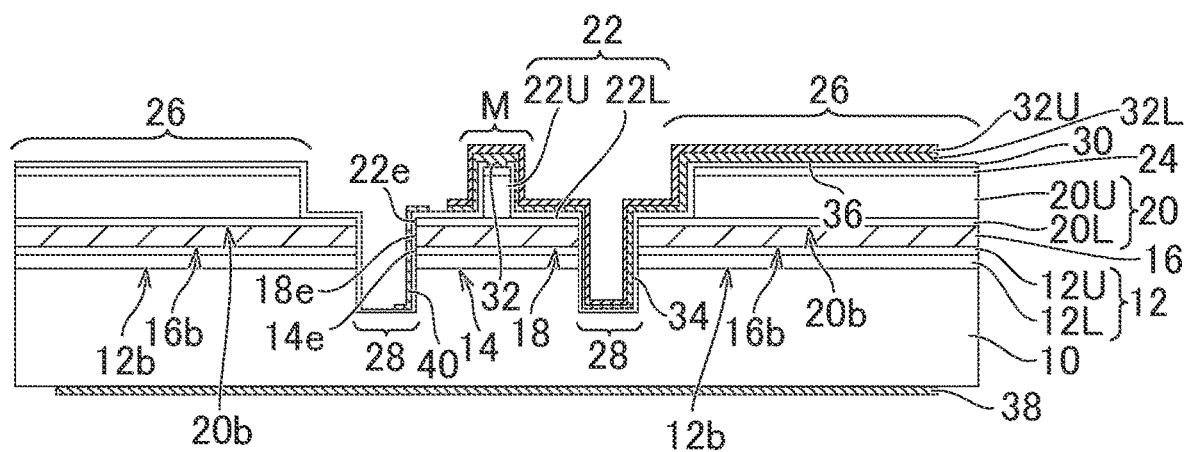
FIG. 2 is a II-II line cross-sectional view of the ridge type semiconductor optical device in FIG. 1.
Figure 3:
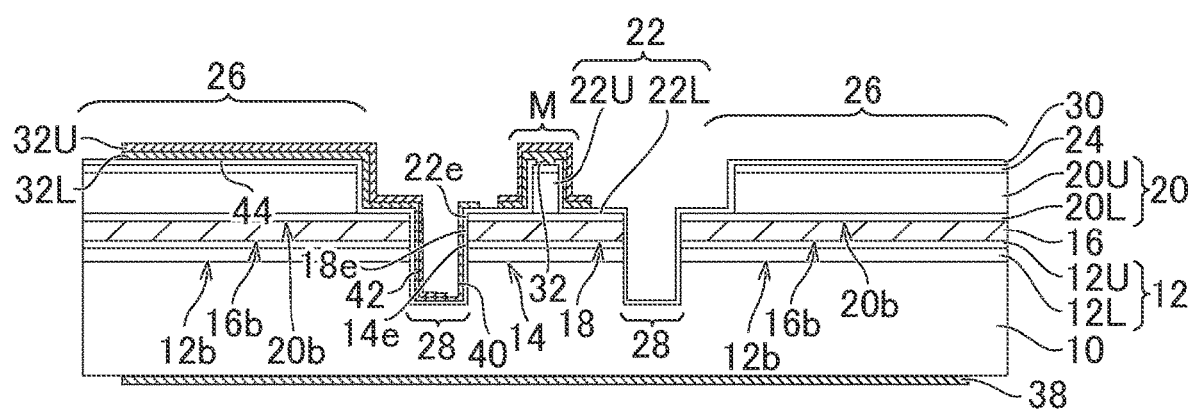
FIG. 3 is a III-III line cross-sectional view of the ridge type semiconductor optical device in FIG. 1.

FIG. 1 is a plan view of a ridge type semiconductor optical device in an implementation. FIG. 2 is a II-II line cross-sectional view of the ridge type semiconductor optical device in FIG. 1. FIG. 3 is a III-III line cross-sectional view of the ridge type semiconductor optical device in FIG. 1. The ridge type semiconductor optical device is a directly modulated semiconductor laser of 1.3 μm band or may be an electric field absorption modulator. The ridge type semiconductor optical device has a semiconductor substrate 10 (e.g., InP substrate).

A first conductivity type semiconductor layer 12 is laminated on the semiconductor substrate 10. The first conductivity type semiconductor layer 12 includes a first lower layer 12L (e.g., n-type buffer layer) and a first upper layer 12U (e.g., n-type guide layer). The first conductivity type semiconductor layer 12 includes a first stripe section 14. The first conductivity type semiconductor layer 12 includes another portion 12b spaced from an end face 14e of the first stripe section 14.

The ridge type semiconductor optical device has an active layer 16. The active layer 16 is a multiple quantum well layer. The active layer 16 includes an active stripe section 18 laminated on the first stripe section 14. The active layer 16 includes another portion 16b spaced from an end face 18e of the active stripe section 18.

The ridge type semiconductor optical device has a second conductivity type semiconductor layer 20. The second conductivity type semiconductor layer 20 includes a second lower layer 20L (e.g., p-type guide layer) and a second upper layer 20U (e.g., p-type clad layer). The second conductivity type semiconductor layer 20 includes a second stripe section 22 laminated on the active stripe section 18. The second stripe section 22 is composed of multiple layers. The multiple layers include a lower layer 22L (part of the second lower layer 20L). The multiple layers include an upper layer 22U (part of the second upper layer 20U) narrower in width than the lower layer 22L. The upper layer 22U constitutes at least part of a mesa stripe structure M. The mesa stripe structure M has an unillustrated diffraction grating between the lower layer 22L and the upper layer 22U. The second conductivity type semiconductor layer 20 includes another portion 20b spaced from an end face 22e of the second stripe section 22. A contact layer 24 (e.g., p-type contact layer) is laminated on the second conductivity type semiconductor layer 20.

The second upper layer 20U and the contact layer 24 are separated, by removing their parts, to have a portion for the mesa stripe structure M in a striped shape and a bank section 26 spaced from and on both sides of the portion. There is an isolation trench 28, between the mesa stripe structure M and the bank section 26, that reaches the semiconductor substrate 10. The isolation trench 28 is formed in the first conductivity type semiconductor layer 12, the active layer 16, and the second conductivity type semiconductor layer 20 (between both ends in a vertical direction in FIG. 1). The isolation trench 28 has a bottom in the semiconductor substrate 10. The isolation trench 28 has an inner surface, parts of which are end faces 14e, 18e, 22e.

The ridge type semiconductor optical device has an insulation film 30 (e.g., passivation film made of $SiO_2$). The insulation film 30 is formed on the inner surface of the isolation trench 28 as well. The insulation film 30 is on the end faces 14e, 18e, 22e of the first stripe section 14, the active stripe section 18, and the second stripe section 22, respectively. The insulation film 30 is on the semiconductor substrate 10 at the bottom of the isolation trench 28. The contact layer 24 is also covered with the insulation film 30. The insulation film 30, at a top of the mesa stripe structure M, has an opening for electrical connection to the contact layer 24.

The ridge type semiconductor optical device has a ridge electrode 32 (e.g., p-type electrode) laminated on the second stripe section 22. The ridge electrode 32 covers the mesa stripe structure M on both sides from a lower part to an upper part. The ridge electrode 32 is a laminate of parts of respective layers of a conductive multilayer films. The ridge electrode 32 includes the lowest layer 32L (e.g., Ti layer) and the uppermost layer 32U (e.g., Au layer), and there may be an unillustrated interlayer (e.g., Pt layer) between them.

The ridge type semiconductor optical device has a ridge draw-out line 34. The ridge draw-out line 34 is connected to the ridge electrode 32, extends in a direction away from the ridge electrode 32, through the inner surface of the isolation trench 28. There is a ridge pad 36 on one of the bank sections 26. The ridge draw-out line 34 connects the ridge electrode 32 and the ridge pad 36. The ridge pad 36 and the ridge draw-out line 34 are a laminate of parts of respective layers of the conductive multilayer films and are integrally continuous with the ridge electrode 32.

A counter electrode 38 (e.g., n type electrode) is formed on a back of the semiconductor substrate 10 and covers almost the entire back surface. By applying a current between the ridge electrode 32 and the counter electrode 38, the active layer 16 (active stripe section 18), under the mesa stripe structure M, emits light.

The directly modulated semiconductor laser is configured to work without temperature adjustment, i.e. uncooled, under operation temperature of −5° C. to +85° C. By contrast, operation under a wider temperature range such as from −40° C. to +95° C. leads to greater fluctuation of characteristics at low temperature and at high temperature, making it difficult to secure satisfactory characteristics under uncooled operation. Employing a design to provide a satisfactory optical output at high temperature leads to a drop of current density in the active layer 16 with the multiple quantum well, due to smaller operation current at low temperature than at high temperature, thereby destabilizing an oscillation mode. This causes problems such as deterioration of transmission characteristics. On the contrary, employing a design to provide a stable operation at low temperature leads to an insufficient optical output at high temperature and deterioration of transmission characteristics.

The ridge type semiconductor optical device has a film heater 40. The film heater 40 extends along the isolation trench 28. In the implementation, there are isolation trenches 28 on both sides of the mesa stripe structure M but the film heater 40 is formed only in one of the isolation trenches 28 on the side opposite to a draw-out direction of the ridge draw-out line 34 from the ridge electrode 32.

The film heater 40 is on the insulation film 30 and overlaps with the end face 14e of at least the first stripe section 14. This improves heat efficiency because the film heater 40 is close to the active stripe section 18. The insulation film 30 under the film heater 40 is an oxide film and has a heat insulation effect but has a low thermal conductivity compared to a metal layer or a semiconductor layer, enabling direct transmission of heat generated in the film heater 40 to the active layer 16 without diffusion.

The film heater 40 is part of remaining layers (e.g., lowest layer 32L, unillustrated interlayer) except for at least one layer (e.g., uppermost layer 32U) of the conductive multilayer films. The film heater 40 has a lower surface, made from titanium, in close-fitting with the insulation film 30. The titanium has excellent close-fitting properties with the oxide film, decreasing separation from the insulation film 30 made of the oxide film.

The film heater 40 is formed to overlap with the end face 18e of the active stripe section 18 as well. The film heater 40 is formed to also overlap with the end face 22e of the lower layer 22L of the second stripe section 22. The film heater 40 is formed to also overlap with the upper surface edge of the lower layer 22L of the second stripe section 22.

Figure 4:
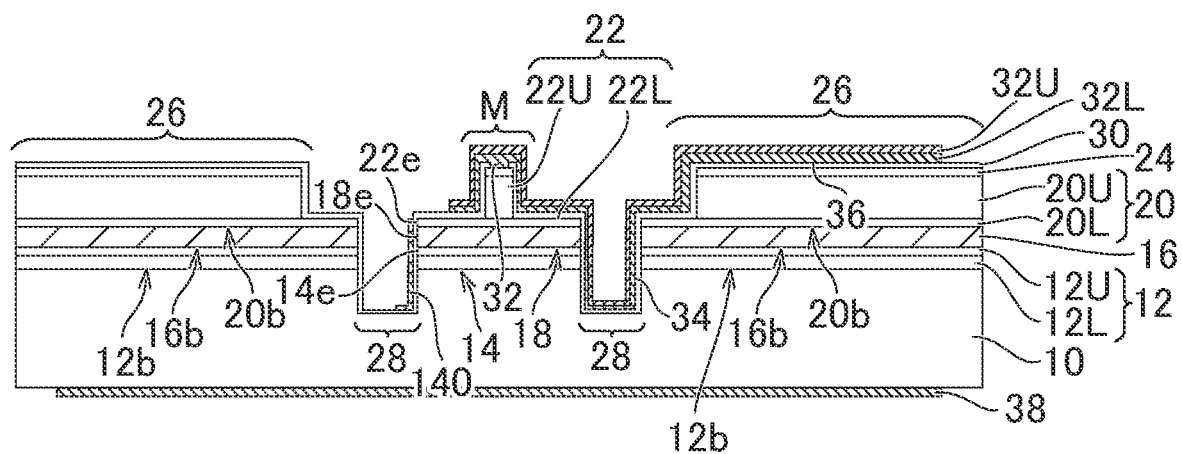
FIG. 4 is a cross-sectional view of a ridge type semiconductor optical device in a variation 1.

FIG. 4 is a cross-sectional view of a ridge type semiconductor optical device in a variation 1. In the variation 1, the film heater 140 overlaps with the end face 14e of the first stripe section 14, the end face 18e of the active stripe section 18, and the end face 22e of the lower layer 22L of the second stripe section 22, but does not overlap with the upper surface edge of the lower layer 22L of the second stripe section 22. The film heater 140 has one edge inside the isolation trench 28 so as not to cover the lower part of the mesa stripe structure M. The variation 1 can also efficiently heat the active stripe section 18.

Keeping a smaller distance between the pair of isolation trenches 28, with the mesa stripe structure M interposed therebetween, is preferable from aspects of high-speed operation. This makes a narrow terrace section (portion protruding from the upper layer 22U of the lower layer 22L) on either side of the mesa stripe structure M, with the ridge electrode 32 and the film heater 140 close to each other, whereas the structure in the variation 1 can effectively prevent short circuit.

Figure 5:
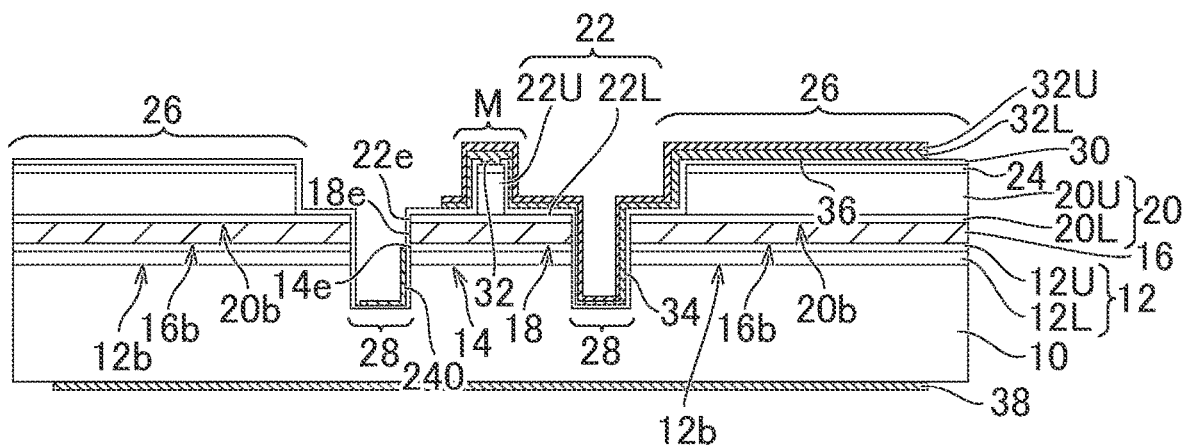
FIG. 5 is a cross-sectional view of a ridge type semiconductor optical device in a variation 2.

FIG. 5 is a cross-sectional view of a ridge type semiconductor optical device in a variation 2. In the variation 2, the film heater 240 overlaps with the end face 14e of the first stripe section 14 but overlaps with neither the end face 18e of the active stripe section 18, the end face 22e of the lower layer 22L of the second stripe section 22, nor the upper surface edge of the lower layer 22L of the second stripe section 22. In the variation 2, the active stripe section 18 is heated through the first stripe section 14.

The film heater 240 may fail to cover the end face 18e of the active stripe section 18 while being formed on the inner surface of the isolation trench 28, due to manufacturing variation. However, the height from the bottom of the isolation trench 28 to the active layer 16 is as small as a few tens of nm, enough to heat the active layer 16 by fully transmitting the heat generated in the film heater 240. In other words, the film heater 240 can achieve a heating effect if it covers the end face 14e of at least the first stripe section 14.

The ridge type semiconductor optical device has a pair of heater draw-out lines 42. The pair of heater draw-out lines 42 are connected to both respective ends of the film heater 240 and extend in a direction away from the film heater 240. The pair of heater draw-out lines 42 cross the isolation trench 28 along the inner surface of the isolation trench 28. Each of the pair of heater draw-out lines 42 is a laminate of parts of respective layers of the conductive multilayer films. The draw-out direction of the pair of heater draw-out lines 42 from the film heater 240 is opposite to the draw-out direction of the ridge draw-out line 34 from the ridge electrode 32. Accordingly, the film heater 240 and the ridge electrode 32 are not either physically or electrically connected.

There are a pair of heater pads 44, on one of the bank sections 26 closer to the film heater 240, for electrical connection to the film heater 240. Each heater pad 44 is also a laminate of parts of respective layers of the conductive multilayer films. The conductive multilayer films, which constitute the heater draw-out line 42 and the heater pads 44, are integrally continuous with the film heater 240, except for at least one layer (e.g., the uppermost layer 32U). Or, the film heater 240, the heater draw-out line 42, and heater pads 44 are integrally formed. The film heater 240 consisting of fewer layers has a greater resistance value than each of the heater draw-out line 42 and the heater pads 44. By applying current to the pair of heater pads 44, the film heater 240 heats up and can heat the active layer 16 (active stripe section 18), which is most influential for characteristics.

The ridge type semiconductor optical device is used on a submount (not shown) made of a ceramic substrate, for example. The submount has a wiring pattern (not shown) formed thereon. The wiring pattern includes a pair of connection lines for driving and a pair of connection lines for heating (not shown). One connection line for driving is connected to the ridge pad 36 with a wire, another connection line is connected to the counter electrode 38. The pair of connection lines for heating are connected to the pair of respective heater pads 44. Binary electric signals for communication signals are transmitted to the pair of connection lines for driving from outside. Specifically, a high-level current IH and a low-level current $I_L$, with a drive current $I_{op}$ centered therebetween, are applied to be high frequency signals that alternate in response to transmission signals. 25 Gbps electric signals are applied here. Under parameters of operation at −40° C. to +95° C., if the drive current $I_{op}$, the high-level current $I_H$, and the low-level current $I_L$ are changed to predetermined values, stable characteristics can be achieved. The drive current $I_{op}$ is larger at higher operation temperature: 20 mA at 0° C., 70 mA at 95° C. On the other hand, at the operation temperature as low as −40° C., the drive current $I_{op}$ is single-digit to adjust the optical output intensity as high as at 0° C. That is why current density in a light-emitting region drops and operation is made unstable.

The implementation can achieve stable operation by activating the film heater 240, raising the effective temperature of the active layer 16, increasing the drive current $I_{op}$, and preventing the current density from dropping. A current of 90 mA may be applied to the film heater 240 only under temperature of −40° C. to 0° C. The film heater 240 may be designed in thickness and size to have resistance value of 60Ω. By applying 90 mA current, the film heater 240 heats the active stripe section 18 by about 40° C. Thus, by applying the current to the film heater 240 under the operation temperature of −40° C., the effective temperature of the active layer 16 can be made almost 0° C., thereby enabling operation with a drive current $I_{op}$ of 20 mA, preventing the current density from dropping, and achieving the stable operation. The current applied to the film heater 240 may vary in accordance with the operation temperature or may be constant only under a certain temperature range.

FIGS. 6 to 14 are diagrams for explaining a manufacturing method of the ridge type semiconductor optical device. In the implementation, the semiconductor substrate 10 made from n-type semiconductor is prepared in a wafer shape, prior to film formation and patterning processes.

Figure 6:
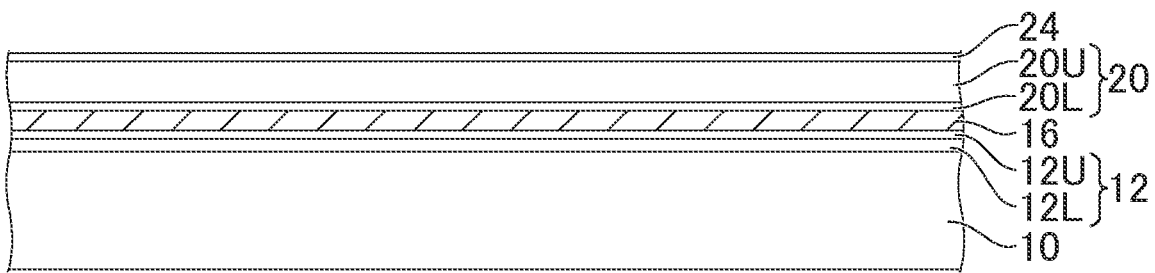
FIG. 6 is a diagram for explaining a manufacturing method of the ridge type semiconductor optical device.

FIG. 6 shows that compound semiconductor layers are laminated on the semiconductor substrate 10 using a metal chemical vapor deposition equipment (MOCVD) method. The compound semiconductor layers include the first lower layer 12L made from n-type InP, the first upper layer 12U made from n-type InGaAlAs, the active layer 16 of a strained multiple quantum well structure including an n-type InGaAlAs well layer with an InGaAlAs barrier layer, the second lower layer 20L made from p-type InGaAlAs, the second upper layer 20U made from p-type InP, and the contact layer 24 made from InGaAs. The InGaAlAs-based material may be replaced with InGaAsP-based material.

Figure 7:
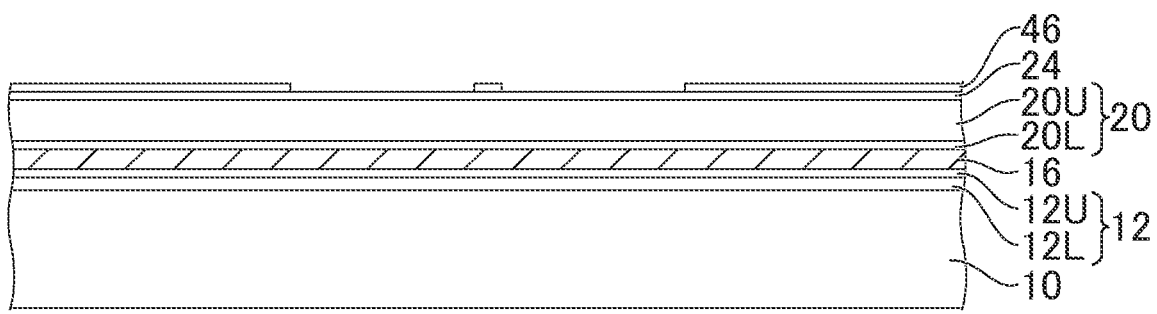
FIG. 7 is a diagram for explaining the manufacturing method of the ridge type semiconductor optical device.

FIG. 7 shows that an inorganic film 46 (e.g., oxide film such as $SiO_2$ film) is formed on a surface of the contact layer 24, and the inorganic film 46 is patterned by photolithography. The patterned inorganic film 46 is used for an etching mask to etch the contact layer 24. Thus, an opening is formed in the contact layer 24, on both sides of an area for forming the mesa stripe structure M, leaving a strip-shaped portion of the contact layer 24. The strip-shaped portion of the contact layer 24 has a width of 2.0 μm. The opening of the contact layer 24 has a width of 12 μm.

Figure 8:
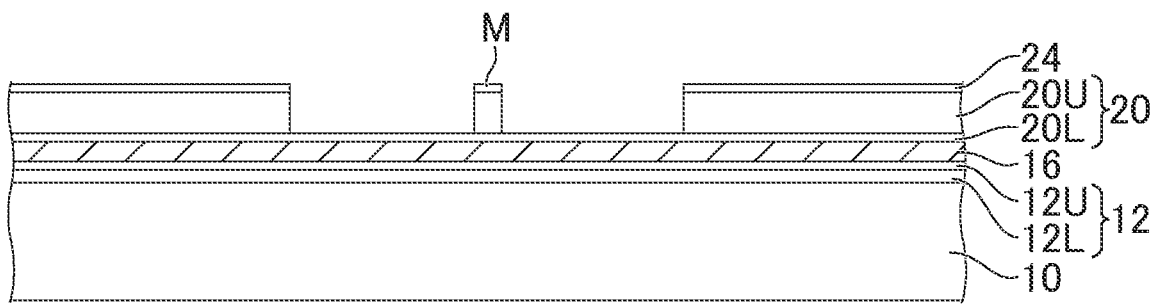
FIG. 8 is a diagram for explaining the manufacturing method of the ridge type semiconductor optical device.

FIG. 8 shows that the second upper layer 20U is etched to form the mesa stripe structure M. The etching is wet etching. The second lower layer 20L serves as an etching stop layer.

Figure 9:
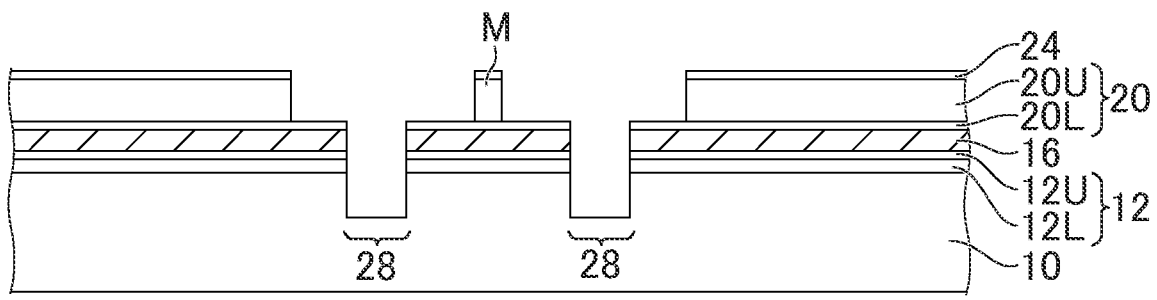
FIG. 9 is a diagram for explaining the manufacturing method of the ridge type semiconductor optical device.

FIG. 9 shows that the isolation trenches 28 are formed. Specifically, an unillustrated resist mask is formed, except in areas to form the isolation trenches 28, and the layers from the second lower layer 20L to the semiconductor substrate 10 are etched. Each isolation trench 28 has a width of 4.0 μm and a depth of 1.5 μm, while the shortest distance between the inner surface of each isolation trench 28 and the mesa stripe structure M is 5.0 μm.

Figure 10:
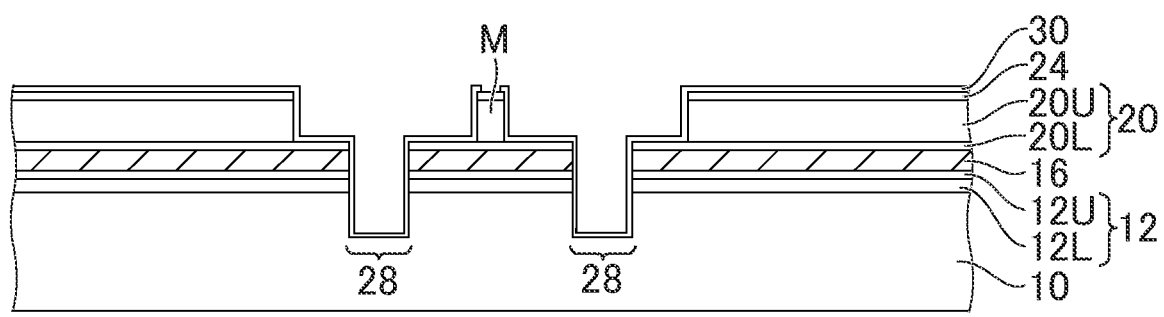
FIG. 10 is a diagram for explaining the manufacturing method of the ridge type semiconductor optical device.

FIG. 10 shows that the insulation film 30 with a thickness of 0.5 μm is formed, by CVD (Chemical Vapor Deposition) method, all over the element surface (including the mesa stripe structure M, the isolation trench 28, and the bank section 26). An opening is formed in the insulation film 30 on the upper surface of the mesa stripe structure M, using dry etching, for electrical connection to the mesa stripe structure M.

Figure 11:
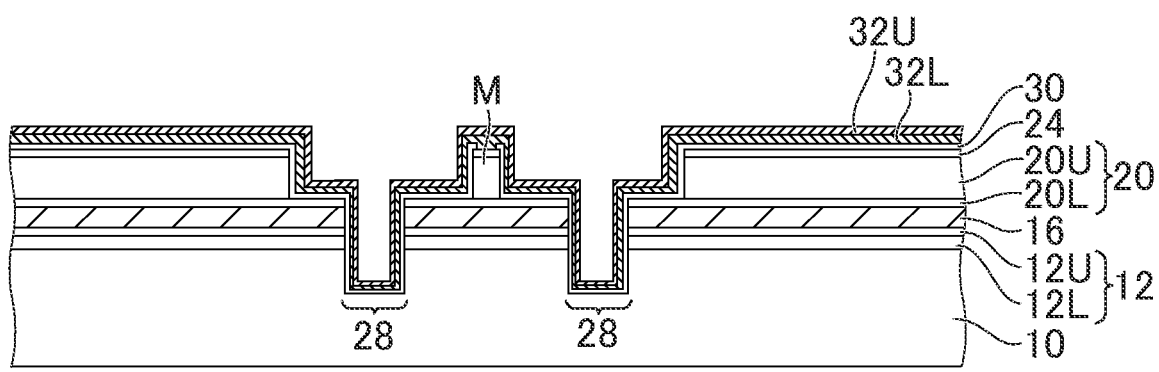
FIG. 11 is a diagram for explaining the manufacturing method of the ridge type semiconductor optical device.

FIG. 11 shows that the conductive multilayer films are formed by electron-beam deposition method. The conductive multilayer films include the lowest layer 32L made from Ti, the uppermost layer 32U made from Au, and the interlayer (not shown) made from Pt. The total film thickness of the uppermost layer 32U and the interlayer is about 100 nm, and the film thickness of the uppermost layer 32U is about 1.0 µm. The lowest layer 32L and the interlayer may be made from Cr layers instead of the Ti layer and the Pt layer.

Figure 12:
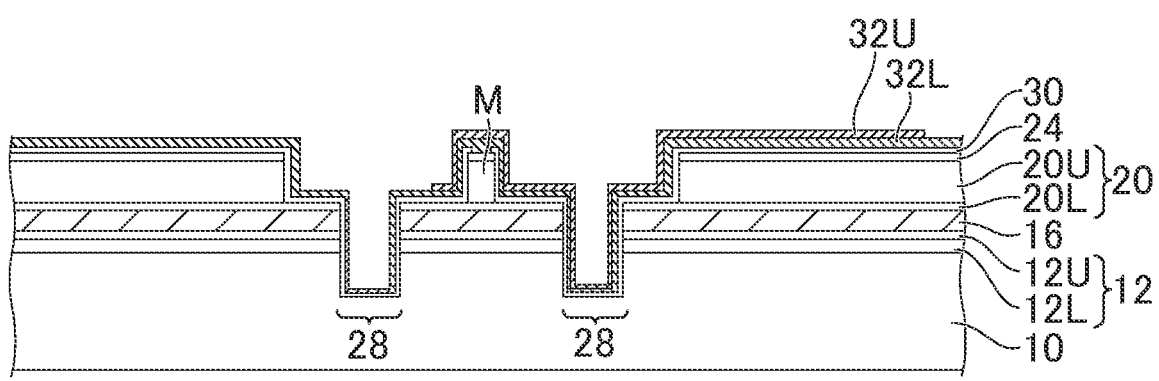
FIG. 12 is a diagram for explaining the manufacturing method of the ridge type semiconductor optical device.

FIG. 12 shows that part of at least one layer (e.g., the uppermost layer 32U) of the conductive multilayer films is etched using an unillustrated resist pattern for a mask. An area to form the film heater 40 is etched. Areas to form the ridge electrode 32, the ridge draw-out line 34, the ridge pad 36, the heater draw-out line 42, and the heater pad 44 are left unetched. Another at least one layer (e.g., the lowest layer 32L) of the conductive multilayer films is not at all etched yet.

Figure 13:
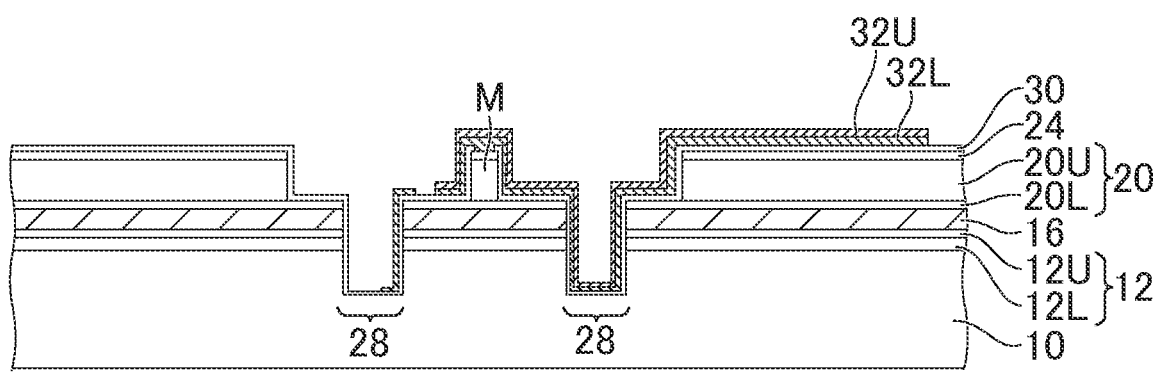
FIG. 13 is a diagram for explaining the manufacturing method of the ridge type semiconductor optical device.

FIG. 13 shows that the conductive multilayer films are patterned. Areas to form the ridge electrode 32, the ridge draw-out line 34, the ridge pad 36, the heater pad 44, the heater draw-out line 42, and the film heater 40 are left without the patterning. An ion milling method is applied to the patterning.

Figure 14:
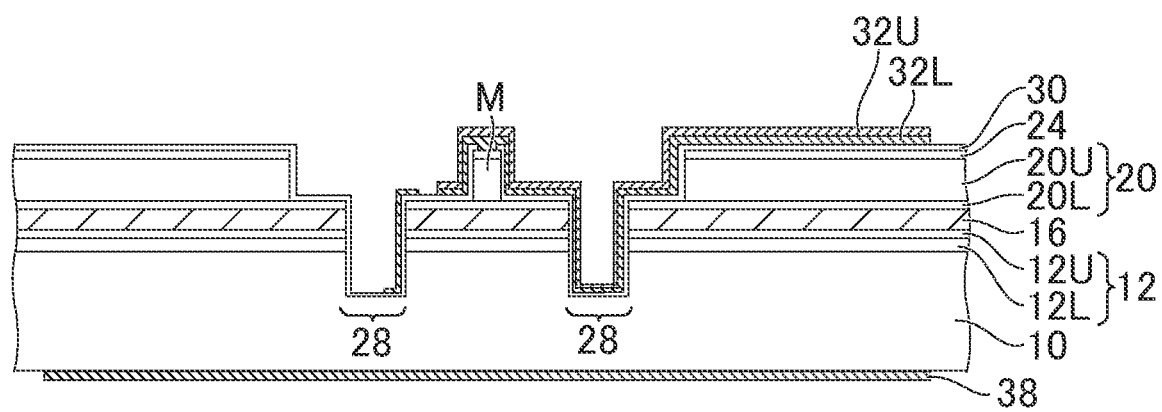
FIG. 14 is a diagram for explaining the manufacturing method of the ridge type semiconductor optical device.

FIG. 14 shows that the semiconductor substrate 10 on a back is grinded to have a desired thickness, and the counter electrode 38 is formed. Then, after a heating process, wafer processes end. The semiconductor substrate 10 in a wafer shape is cleaved, along a direction perpendicular to the mesa stripe structure M, into bar shapes. The width of each bar is designed to be a desired cavity length such as 200 µm. The bar-shaped element has a cleaved front edge face, on which an anti-reflection coating (AR coating) film is formed by a sputtering method, while a cleaved back edge face similarly has a high reflection coating (HR coating) film formed thereon. Then, some elements arranged in a longitudinal direction of the bars are cut into the respective elements.

Figure 15:
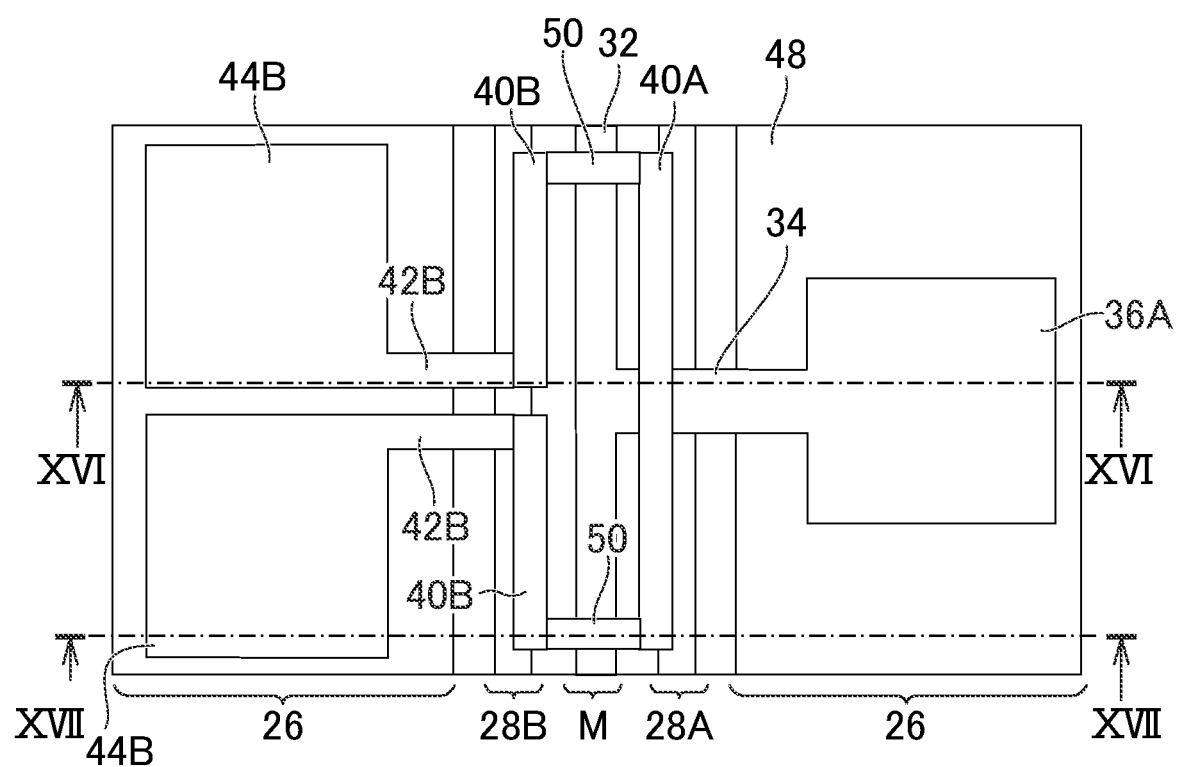
FIG. 15 is a plan view of a ridge type semiconductor optical device according to an implementation.
Figure 16:
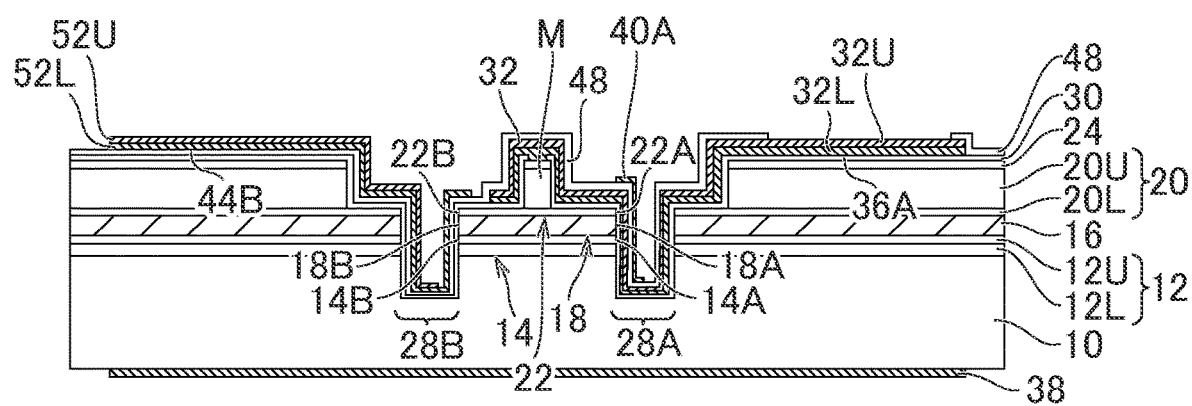
FIG. 16 is a XVI-XVI line cross-sectional view of the ridge type semiconductor optical device in FIG. 15.
Figure 17:
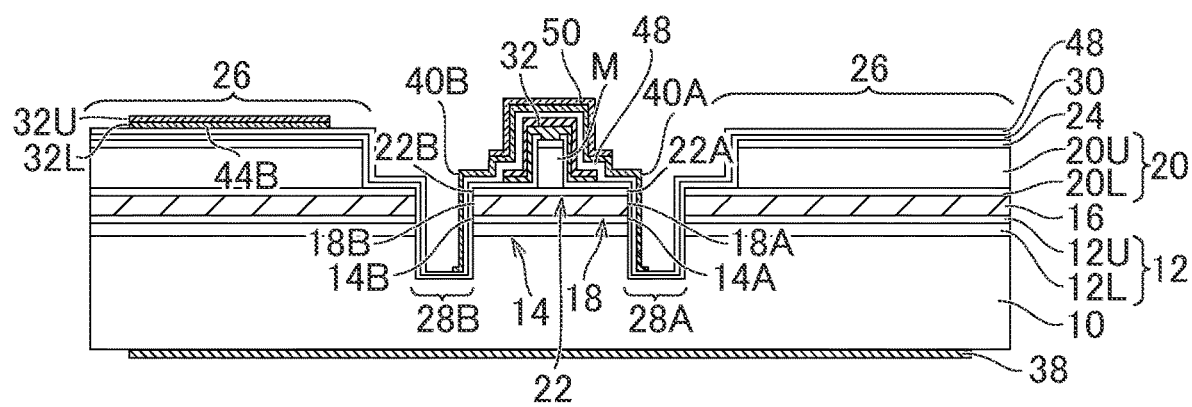
FIG. 17 is a XVII-XVII line cross-sectional view of the ridge type semiconductor optical device in FIG. 15.

FIG. 15 is a plan view of a ridge type semiconductor optical device in an implementation. FIG. 16 is a XVI-XVI line cross-sectional view of the ridge type semiconductor optical device in FIG. 15. FIG. 17 is a XVII-XVII line cross-sectional view of the ridge type semiconductor optical device in FIG. 15.

The first isolation trench 28A and the second isolation trench 28B are formed on respective both sides of the first stripe section 14, the active stripe section 18, and the second stripe section 22. Each of the first end faces 14A, 18A, 22A and the second end faces 14B, 18B, 22B is included in the inner surface of a corresponding one of the first isolation trench 28A and the second isolation trench 28B.

The insulation film 30 is formed along the inner surface of each of the first isolation trench 28A and the second isolation trench 28B. The insulation film 30 is also formed on the first end faces 14A, 18A, 22A and the second end faces 14B, 18B, 22B of the first stripe section 14, the active stripe section 18, and the second stripe section 22. The first conductive multilayer films (lowest layer 32L, unillustrated interlayer, uppermost layer 32U) are formed on the insulation film 30. The ridge electrode 32, the ridge draw-out line 34, and the ridge pad 36A are respective parts of the first conductive multilayer films.

The ridge electrode 32 and the ridge draw-out line 34 are covered with the second insulation film 48 (e.g., SiO$_2$ film). At least a central portion of the ridge pad 36A is exposed from the second insulation film 48. The second conductive multilayer films (second the lowest layer 52L, unillustrated interlayer, second the uppermost layer 52U) are formed on the second insulation film 48. The first film heater 40A, the second film heater 40B, the heater draw-out lines 42B, and the heater pads 44B are respective parts of the second conductive multilayer films. The second insulation film 48 should be interposed between at least overlapping portions of the first conductive multilayer films and the second conductive multilayer films.

The first film heater 40A and the second film heater 40B are designed to overlap with the first end faces 14A, 18A, 22A and the second end faces 14B, 18B, 22B, respectively. This makes it possible to heat the active stripe section 18 on both sides, improve the heat efficiency, and stabilize heat distribution. The variation 1 or 2 may be applied to each of the first film heater 40A and the second film heater 40B.

The first film heater 40A and the second film heater 40B are connected in series. The second film heater 40B is composed of a pair of second film heaters 40B that are separated. The first film heater 40A is connected in series between the pair of second film heaters 40B. Each second film heater 40B and the first film heater 40A are connected in series with a connection line 50. The second insulation film 48 is interposed between the connection line 50 and the ridge electrode 32. The first film heater 40A and the ridge draw-out line 34 are electrically insulated and intersected, due to the second insulation film 48 being interposed therebetween.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A ridge type semiconductor optical device, comprising:
a first conductivity type semiconductor layer including at least a first stripe section;
an active layer including at least an active stripe section on the first stripe section;
a second conductivity type semiconductor layer including at least a second stripe section on the active stripe section;
a ridge electrode on the second stripe section;
an insulation film on an end face of each of the first stripe section, the active stripe section, and the second stripe section; and
a film heater on the insulation film, the film heater overlapping with the end face of at least the first stripe section.

2. The ridge type semiconductor optical device of claim 1, wherein the film heater is configured to overlap with the end face of the active stripe section.

3. The ridge type semiconductor optical device of claim 2, wherein the second stripe section is composed of multiple layers including a lower layer and an upper layer, the upper layer being narrower in width than the lower layer and constituting at least part of a mesa stripe structure, and
the film heater is configured to overlap with an end face of the lower layer of the second stripe section.

4. The ridge type semiconductor optical device of claim 3, wherein the film heater is configured to overlap with an upper surface edge of the lower layer of the second stripe section.

5. The ridge type semiconductor optical device of claim 1, wherein
the first conductivity type semiconductor layer includes another portion spaced from the end face of the first stripe section,
the active layer includes another portion spaced from the end face of the active stripe section,
the second conductivity type semiconductor layer includes another portion spaced from the end face of the second stripe section, and
an isolation trench is formed to have an inner surface, part of which is the end face.

6. The ridge type semiconductor optical device of claim 5, further comprising:
a semiconductor substrate under the first conductivity type semiconductor layer,
wherein the isolation trench has a bottom in the semiconductor substrate.

7. The ridge type semiconductor optical device of claim 5, further comprising:
a pair of heater draw-out lines connected to respective both ends of the film heater, extending in a direction away from the film heater, and passing through the inner surface of the isolation trench; and
a ridge draw-out line connected to the ridge electrode, extending in a direction away from the ridge electrode, and passing through the inner surface of the isolation trench.

8. The ridge type semiconductor optical device of claim 7, wherein
each of the pair of heater draw-out lines is a laminate of parts of respective layers of a conductive multilayer films, and
the film heater is part of all but at least one layer of the conductive multilayer films.

9. The ridge type semiconductor optical device of claim 7, wherein a draw-out direction of the pair of heater draw-out lines from the film heater is opposite to a draw-out direction of the ridge draw-out line from the ridge electrode.

10. The ridge type semiconductor optical device of claim 7, wherein
the isolation trench includes a first isolation trench and a second isolation trench, the first isolation trench and the second isolation trench being formed on both sides of the first stripe section, the active stripe section, and the second stripe section,
the end face includes a first end face and a second end face, each of the first end face and the second end face being part of the inner surface of a corresponding of the first isolation trench and the second isolation trench, and
the film heater includes a first film heater and a second film heater, the first film heater and the second film heater overlapping with the first end face and second end face, respectively.

11. The ridge type semiconductor optical device of claim 10, wherein the first film heater and the ridge draw-out line are electrically insulated and intersect with each other.

12. The ridge type semiconductor optical device of claim 10, wherein the first film heater and the second film heater are connected in series.

13. The ridge type semiconductor optical device of claim 12, wherein
the second film heater is composed of a pair of second film heaters that are separated, and
the first film heater is connected in series between the pair of second film heaters.

14. The ridge type semiconductor optical device of claim 1, wherein the film heater has a lower surface, which is made of titanium, in close-fitting with the insulation film.

* * * * *